United States Patent [19]

Wootton et al.

[11] 3,830,956

[45] Aug. 20, 1974

[54] MULTILAYER PRINTED CIRCUIT BOARD WITH TEST PADS

[75] Inventors: Derek Sidney Wootton, Hitchin; Colin Sidney Osborne, Sandy, both of England

[73] Assignee: International Computers Limited, London, England

[22] Filed: Mar. 27, 1973

[21] Appl. No.: 345,302

[30] Foreign Application Priority Data

Mar. 28, 1972 Great Britain .................... 14401/72

[52] U.S. Cl. .......... 174/68.5, 317/101 CM, 324/51, 324/73 PC, 339/17 R, 339/17 E

[51] Int. Cl. .............................................. H05k 1/02

[58] Field of Search.... 174/68.5; 317/101 B, 101 C, 317/101 CC, 101 CM, 101 D, 101 DH; 324/73 PC, 73 R; 339/17 C, 17 R, 17 E

[56] References Cited

UNITED STATES PATENTS

| | | | |
|---|---|---|---|
| 3,234,433 | 2/1966 | Braunagel | 317/101 D |
| 3,431,350 | 3/1969 | Haberecht | 317/101 CC X |
| 3,626,086 | 12/1971 | Rubey | 174/68.5 |

*Primary Examiner*—Darrell L. Clay

*Attorney, Agent, or Firm*—Misegades, Douglas & Levy

[57] ABSTRACT

A construction of printed circuit board is disclosed in which conductive pads are arranged on the surface of a printed circuit board for contacting by probes of a test rig and which are connected to conductive tracks of the circuit board which otherwise may be inaccessible for test purposes.

3 Claims, 4 Drawing Figures

MULTILAYER PRINTED CIRCUIT BOARD WITH TEST PADS

BACKGROUND OF THE INVENTION

The invention relates to circuit boards and to the testing of circuit components mounted on such boards.

It is common practice for a single board to serve as a mount for several components, which components may include integrated circuits, with the board incorporating conductive tracks. These tracks connect appropriate mounting positions for terminal leads of the components both to power supply rails and to other such mounting positions to achieve appropriate component interconnections. Testing the operation of the components on such a board has involved making electrical contact individually between conductive probes or pins of a test rig and the component terminal leads after these have been mounted, e.g. by being soldered in plated-through holes through which the leads extend at the mounting positions. Difficulties in making satisfactory contact arise from differences in the length, thickness or resilience of the terminal leads and/or the size, particularly the height, of solder used to fix the leads.

For many applications, for example main frame computer manufacture, it is convenient to use a multipurpose board having a large plurality of mounting positions in a standard array. This allows maximum flexibility in the positioning of individual integrated circuits and their terminal leads. The individuality of any particular board derives from the integrated circuits and other components it will carry and is embodied in the patterns of conductive tracks and their connections to particular mounting positions. There will generally be far less tracks on any particular board than there are mounting positions, not only because some tracks interconnect mounting positions but because some of the latter will not be used.

A printed circuit board may have a plurality of possible mounting positions for terminal leads of circuit components including integrated circuit units, the mounting positions being located at locations arranged in a first standard array; a plurality of conductive portions located at locations arranged in a second standard array; and a plurality of conductive tracks interconnecting selected mounting positions, each track connected with at least one conductive portion that is unique to that track.

The conductive tracks may be designed for each particular arrangement of components on a board by program controlled computer techniques. A multilayer board structure can be used with separate layers of conducting tracks for different power supply potentials, respectively, and the circuit interconnections. It is possible to use more than one layer of circuit interconnections and/or include some of the circuit interconnections on a power supply sheet.

In general, the addition of test pads, each of which may not connect with more than one track, in a standard array is a constraint on conductive track design. It can however be conveniently accommodated for a regular array, such as parallel spaced columns of mounting positions by using an interleaved columnar arrangement of test pads, with a part of each gap between columns of mounting positions being considered as a prohibited region for conductive tracks except in the case where they must contact a particular test pad.

One useful type of test rig is part of a special purpose computer peripheral controlled as to the way in which its probes or pins are energised and/or sampled by programs of the computer. In this way, fault finding tests can be supplemented by diagnostic routines.

Until recently, the effort required to write test and/or diagnostic programs where interactions between integrated circuits are concerned, although always significant, has often been worthwhile. Lately, however, the amount and complexity of logic performed by individual integrated circuits has significantly increased, not untypically by a factor of ten. The resulting complexity of programming required for test and/or diagnosis of inter-circuit operations is so great as to be either prohibitively expensive or beyond the present capacity of the art.

It is therefore more convenient to test inter-circuit conductive tracks for continuity only and to test operation of the mounted integrated circuits on an individual basis only. This may be done using an arrangement for isolating individual circuits for the purposes of supplying power to them. Principles for construction and use of convenient arrangements are disclosed in copending application Ser. No. 283,075 of Brian John Procter et al., assigned to the same assignees as the present application. In general, all of the circuits on a board will have their terminals for one power supply potential connected directly to a common line and their terminals for the other power supply potential connected to a common interconnecting line via means affording electrical isolation of the circuits. This is readily achieved using respective diodes, switches, or relatively high resistance elements, with provision for contact by a test rig pin on the circuit sides of such isolating elements. Alternatively, such isolation may be achieved by the removal, or before the initial fitting of, a common conductive bar itself constituting said common interconnecting line. This is readily achieved by coupling leads of the bar to mounting positions terminating each circuits power supply line for said other potential.

SUMMARY OF THE INVENTION

According to one aspect of the invention, a printed circuit board includes a plurality of mounting positions at which circuit component terminal leads can be mounted; a plurality of conductive tracks extending from at least some of the mounting positions; and a plurality of conductive portions all of which are accessible from a surface of the board for electrical contact by probes or pins and each of which is connected to one and only one of the conductive tracks respectively.

DESCRIPTION OF THE DRAWINGS

Details of a preferred practical implementation of the invention will now be given, by way of example, with reference to the accompanying drawing, in which.

DESCRIPTION OF THE PREFERRED EMBODIMENTS

Figures 1, 2, 3, 4:
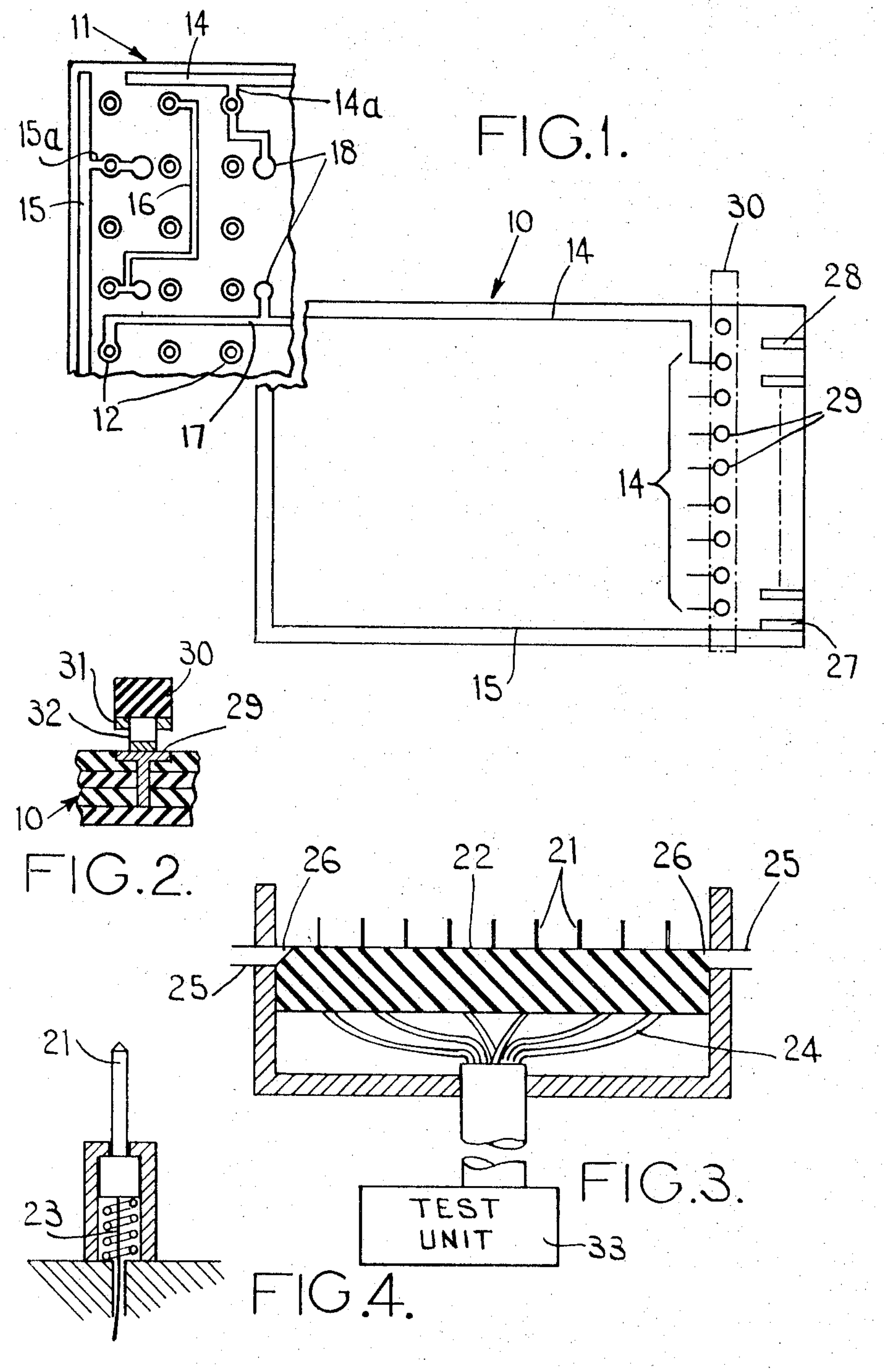
FIG. 1 shows a circuit board in outline and a portion thereof diagrammatically in detail.
FIG. 2 shows a section through part of the circuit board of FIG. 1.
FIG. 3 shows, diagrammatically, a test rig, having a contact pin carrying platform.
FIG. 4 shows details of one of the test rig contact pins.

FIG. 1 shows a multilayer circuit board 10 a corner portion 11 of which appears greatly enlarged and diagrammatically as though all the layers were transparent. The circuit board 10 has a standard arrangement of plated-through holes 12, omitted for clarity except at the corner portion 11, and is intended for mounting a plurality of integrated circuits with the leads thereof connected, e.g. soldered, into selected ones of the holes 12. The standard disposition of the holes 12 enables a single board to serve in many different logic package applications according to the patterns of conductive tracks laid down to extend from the holes 12 and the type and disposition of integrated circuits mounted therein by their leads.

The corner portion 11 of the board 10 is assumed to represent part of an area devoted to one integrated circuit. It shows three types of conductive tracks. The tracks 14 and 15 are power supply rails for different voltages, respectively, required for operation and are each shown with a branch 14*a*, 15*a* extending to one of the plated-through holes corresponding to the power supply lead of the associated integrated circuit. The track 16 serves to connect together two leads of the same integrated circuit as may sometimes be required to achieve a desired mode of operation. The track 17 is for connecting an appropriate circuit lead with a lead of another circuit component on the board.

In general, the power supply tracks and the circuit component lead interconnections will exist on different, mutually insulated layers of the board, and no plated-through hole will be connected to a track on more than one layer.

The circuit board also has a standard arrangement of conductive pads 18 less in number than the number of plated-through holes 12. Each of the individual lead interconnecting conductive tracks 16 and 17 is connected to a conductive pad 18 that is not connected to any other track. Where, as is normal, the interconnecting tracks 16, 17 are all on an outer layer of the board 10, it is sufficient for the pads 18 to be formed only on the surface of that layer, and to be accessible through any protective insulating layer applied over the track pattern bearing surface. As the power supply tracks 14, 15 will be energisable from a stake, such as 27 or 28 or means associated with an isolator 30 to be described, there is no absolute necessity for the power supply tracks 14 and 15 to connect with conductive pads 18 proximate to each integrated circuit component. It may however be convenient to have such access to these tracks 14 and 15, for example, in order to test for track continuity rather than assuming that a fault lies in a circuit component. Also, there may be occasions when it is convenient to place interconnecting tracks 16, 17 on more than one board layer. Then, the pads conveniently comprise flattened end surfaces of conducting material filling holes in the board 10. Connection is made to one only of the conductive tracks of a board layer in similar manner to that used for connections to the plated through holes 12.

Generally there will be a requirement for more mounting positions than conductive pads 18 as lead interconnecting tracks utilise two mounting positions whereas only one pad 18 need be provided for each lead interconnecting track.

The pads 18 present uniform surfaces on the underside of the circuit board 10 and are readily contacted by a "bed of nails" probe type test rig (FIGS. 3 and 4) of conventional form having a matching array of spring loaded contact pins 21 mounted on a bed 22 through which individual connections are made between the pins 21 and wires 23 of one or more cables 24 which are connected to a testing unit 33. A vacuum operated rig is shown diagrammatically for pulling a circuit board onto the bed 22 when air is pumped out of conduits 25 connecting with the space above the bed 22 via notches 26 in the upper part of the bed. Mechanical or other means are equally suitable for bringing and holding a board and the bed pins in contacting relation.

The testing unit 33 is preferably a special purpose computer peripheral operable by computer program to apply predetermined sequences of signals to selected ones of the pins 21.

It is intended that, apart from continuity tests, operational tests of integrated circuits and other components mounted on a circuit board 10 should be performed separately and appropriate decoupling capacitors will be among the components included on any circuit board 10. To this end, an isolating arrangement is included which accords with the principles of the previously mentioned copending application in that each of the circuit components of a circuit board 10 can be tested separately. The integrated circuits or other components are all connected in common to one power supply track, namely that referenced 15. However, at least for each such integrated circuit, there is a separate track for the other power supply potential and these are referenced 14 in FIG. 1. The common track 15 is connected to one terminal stake 27 of the circuit board. The other tracks 14 are also normally commoned to another terminal stake 28 of the circuit board via a common conductor contacting, simultaneously, all of a plurality of conductive pads 29 each of which terminates a different one of the tracks 14.

This removable conductor, as best shown in FIG. 2, is formed or attached, at 31, on one face of an elongated member 30 and is shown with spring contacts 32, such as pressed out portions of an attached conductor 31, for ensuring contact with the pads 29 when the member 30 is correctly located transversely of the board 10 and pressed towards the underside of the board. Clamping of the member 30 is readily achieved in any convenient way and may in fact be done at a back plane into which the end of the board 30 is plugged in conventional manner.

The pads 18 may be formed as an enlarged head of a filled hole that may extend through all layers of the board or not as shown in FIG. 2 for one of the pads 29.

In an alternative isolation arrangement, perhaps of most use at the manufacturing stage in the life of a circuit board, plated-through holes are provided instead of the pads 29 and, instead of the sprung contact conducter member 30, a conducting bar with an integral row of matching teeth like terminal leads is provided for soldering into the holes corresponding to pads 29. Testing prior to assembly of the conducting bar will be achieved either by contact with test pads 18 connected to each power supply track 14 or by direct contact by the probes or pins coacting with the plated-through holes.

We claim:

1. A multilayer printed circuit board, including a plurality of layers of insulating material superposed to form a stack in which each layer has a pair of opposed surfaces, one surface respectively of each of those layers at ends of the stack being exposed, the remainder of the surfaces lying within the interior of the stack, the interior surfaces of at least two different layers carrying conductive tracks formed thereon;

an array of connector positions on one of the opposed surfaces, a connector position including a conductive termination arranged to receive a connecting lead from a circuit component; and a regular pattern of contact pads formed on said exposed surface, pads of the pattern being connected respectively to selected terminations, each pad having a conductive connection passing through at least some of the layers to one of said tracks, the conductive connections of different pads respectively passing through different numbers of layers, whereby connections from different ones of the layers of the board are presented at the exposed surface for test purposes.

2. A multilayer printed circuit board as claimed in claim 1 including an array of holes through the layers of the board, the hole array corresponding to the array of connector positions, in which said conductive connections include conductive material within the holes, the material within a hole being connected to one of the selected terminations and to that one of the tracks with which the selected termination is associated.

3. A multilayer printed circuit board as claimed in claim 2 in which for each connection the conductive material forms a lining to a hole.

* * * * *